(12) United States Patent
Lee et al.

(10) Patent No.: US 8,587,946 B2
(45) Date of Patent: Nov. 19, 2013

(54) SEMICONDUCTOR MODULE SOCKET APPARATUS

(75) Inventors: Joo-Han Lee, Asan-si (KR); Jung-Hoon Kim, Asan-si (KR); Seong-Chan Han, Cheonan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 307 days.

(21) Appl. No.: 12/987,552

(22) Filed: Jan. 10, 2011

(65) Prior Publication Data

US 2011/0170264 A1 Jul. 14, 2011

(30) Foreign Application Priority Data

Jan. 11, 2010 (KR) .................. 10-2010-0002384

(51) Int. Cl.
*H05K 7/20* (2006.01)

(52) U.S. Cl.
USPC ............. 361/713; 361/705; 361/709; 439/68; 439/487; 439/620.2

(58) Field of Classification Search
USPC ................. 361/676–678, 679.46–679.54, 361/688–690, 698–720
See application file for complete search history.

(56) References Cited

U.S. PATENT DOCUMENTS

| 7,061,104 | B2 | 6/2006 | Kenny, Jr. et al. | |
| 7,393,226 | B2 | 7/2008 | Clayton et al. | |
| 7,515,415 | B2 * | 4/2009 | Monfarad et al. | 361/699 |
| 2002/0109518 | A1 * | 8/2002 | Saito et al. | 324/760 |
| 2003/0153199 | A1 * | 8/2003 | Jiten et al. | 439/68 |
| 2004/0077200 | A1 * | 4/2004 | Ishikawa et al. | 439/190 |
| 2004/0252535 | A1 | 12/2004 | Kenny et al. | |
| 2007/0212919 | A1 * | 9/2007 | Clayton et al. | 439/326 |
| 2007/0229103 | A1 * | 10/2007 | Tani | 324/755 |
| 2008/0073116 | A1 * | 3/2008 | Sakai | 174/520 |
| 2008/0251911 | A1 | 10/2008 | Farnsworth et al. | |

FOREIGN PATENT DOCUMENTS

JP 2002366260 12/2002

* cited by examiner

*Primary Examiner* — Courtney Smith
(74) *Attorney, Agent, or Firm* — Harness, Dickey & Pierce, P.L.C.

(57) ABSTRACT

A semiconductor module socket apparatus including a socket main body in which a socket groove corresponding to a semiconductor module is formed; a socket pin mounted in the socket groove of the socket main body so as to be electrically connected to a module pin of the semiconductor module; and a heat radiating member mounted in the socket main body so as to externally radiate heat that is generated in the semiconductor module and then is delivered from the socket groove and the socket pin. According to the semiconductor module socket apparatus, it is possible to prevent the heat generated in the semiconductor module from being delivered to the main board, to increase the heat radiation efficiency, to significantly save an installation space, to reduce the installation costs, and to realize no-noise and no-vibration of the semiconductor module socket apparatus.

18 Claims, 5 Drawing Sheets

SEMICONDUCTOR MODULE SOCKET APPARATUS

CROSS-REFERENCE TO RELATED APPLICATIONS

This application claims the benefit of Korean Patent Application No. 10-2010-0002384, filed on Jan. 11, 2010, in the Korean Intellectual Property Office, the disclosure of which is incorporated herein in its entirety by reference.

BACKGROUND

The inventive concept relates to a semiconductor module socket apparatus, and more particularly, to a semiconductor module socket apparatus for preventing heat from being delivered to a main board of a computer, wherein the heat is generated in a semiconductor module including a semiconductor memory module.

In general, a semiconductor module socket apparatus is mounted in a main board of a computer, has various types of semiconductor modules including a semiconductor memory module or the like, and includes a socket main body whereon a socket groove corresponding to a semiconductor module is formed, and a socket pin that is mounted in the socket groove of the socket main body so as to be electrically connected to a module pin of the semiconductor module.

Thus, an electrical signal of the semiconductor module may be transferred to a main board of a computer in which the socket main body is mounted, in a manner that the module pin of the semiconductor module is electrically connected to the socket pin by inserting the semiconductor module into the socket groove of the socket main body.

Meanwhile, a problem of heat generation due to high integration and large capacity of a semiconductor module increases.

In particular, the heat generation first occurs in the semiconductor module, and although the generated heat is partly radiated to the air according to a heat convection phenomenon, almost 90% of the generated heat is delivered to the main board according to a heat conductivity phenomenon via the socket main body and the socket pin which thermally contact the semiconductor module.

The heat delivered to the main board causes malfunctions in the main board or deteriorates the durability of the main board.

SUMMARY

The inventive concept provides a semiconductor module socket apparatus in which a heat radiating member is mounted in a socket main body that functions as an intermediate element, whereby heat generated in a semiconductor module may be prevented from being delivered to a main board.

The inventive concept also provides a semiconductor module socket apparatus in which a heat delivering medium, a nonconductor thermal interface material, or a heat pipe is arranged to smooth heat exchange with a heat radiating member, whereby a heat radiation efficiency may be increased.

The inventive concept also provides a semiconductor module socket apparatus in which an air cooling type socket main body is mounted, whereby an installation space is significantly saved, the installing costs are reduced since a separate pan or a compulsory cooling device is not necessary, and no-noise and no-vibration of the semiconductor module socket apparatus may be realized.

According to an aspect of the inventive concept, there is provided a semiconductor module socket apparatus including a socket main body in which a socket groove corresponding to a semiconductor module is formed; a socket pin mounted in the socket groove of the socket main body so as to be electrically connected to a module pin of the semiconductor module; and a heat radiating member mounted in the socket main body so as to externally radiate heat that is generated in the semiconductor module and then is delivered from the socket groove and the socket pin.

The socket main body may be for a semiconductor memory module, and the socket pin may be electrically connected to a main board of a computer.

The heat radiating member may include a heat radiating plate that is formed of a metal material and exposed to one surface of the socket main body, or the heat radiating member may include a plurality of heat radiating pins that are formed of a metal material and exposed to one surface of the socket main body.

The semiconductor module socket apparatus may further include a heat delivering medium that is stored in a hollow portion of the socket main body and is thermally connected to the heat radiating member.

The hollow portion may include a connection element including one selected from the group consisting of a linear connection element, a zigzag connection element, or a element having a shape selected from combinations thereof.

The hollow portion may include a first heat delivering medium storage tank formed in one side of the socket groove of the socket main body; a second heat delivering medium storage tank formed in the other side of the socket groove of the socket main body; and a connection element for connection between the first heat delivering medium storage tank and the second heat delivering medium storage tank.

The connection element may include a linear connection element, a zigzag connection element, or a element having a shape selected from combinations thereof.

The socket main body may have a nonconductor thermal interface material (TIM) is arranged between the socket pin and the heat radiating member so as to deliver the heat of the socket pin to the heat radiating member.

The heat radiating member may include a heat pipe to which a working fluid is inserted, and the heat pipe may include a vaporization unit having a porous material formed therein for easy vaporization of the working fluid; a condensation unit in which a condensation accelerating element is formed to allow easy condensation of the working fluid; and a movement element unit for connection between the vaporization unit and the condensation unit.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Hereinafter, the inventive concept will be described in detail by explaining exemplary embodiments of the inventive concept with reference to the attached drawings.

Figure 1:
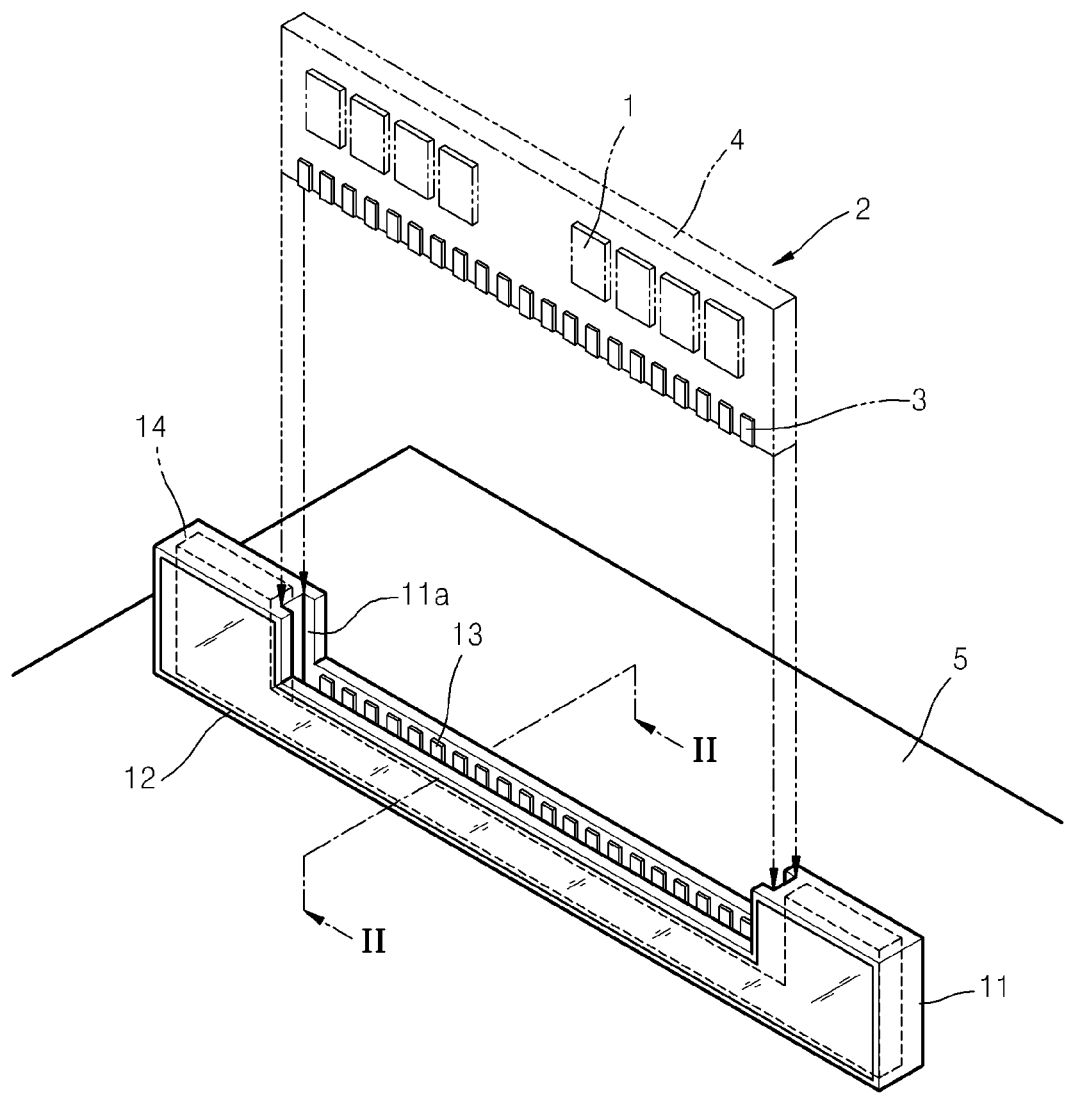
FIG. 1 is a perspective view of a semiconductor module socket apparatus according to an embodiment of the inventive concept.
Figure 2:
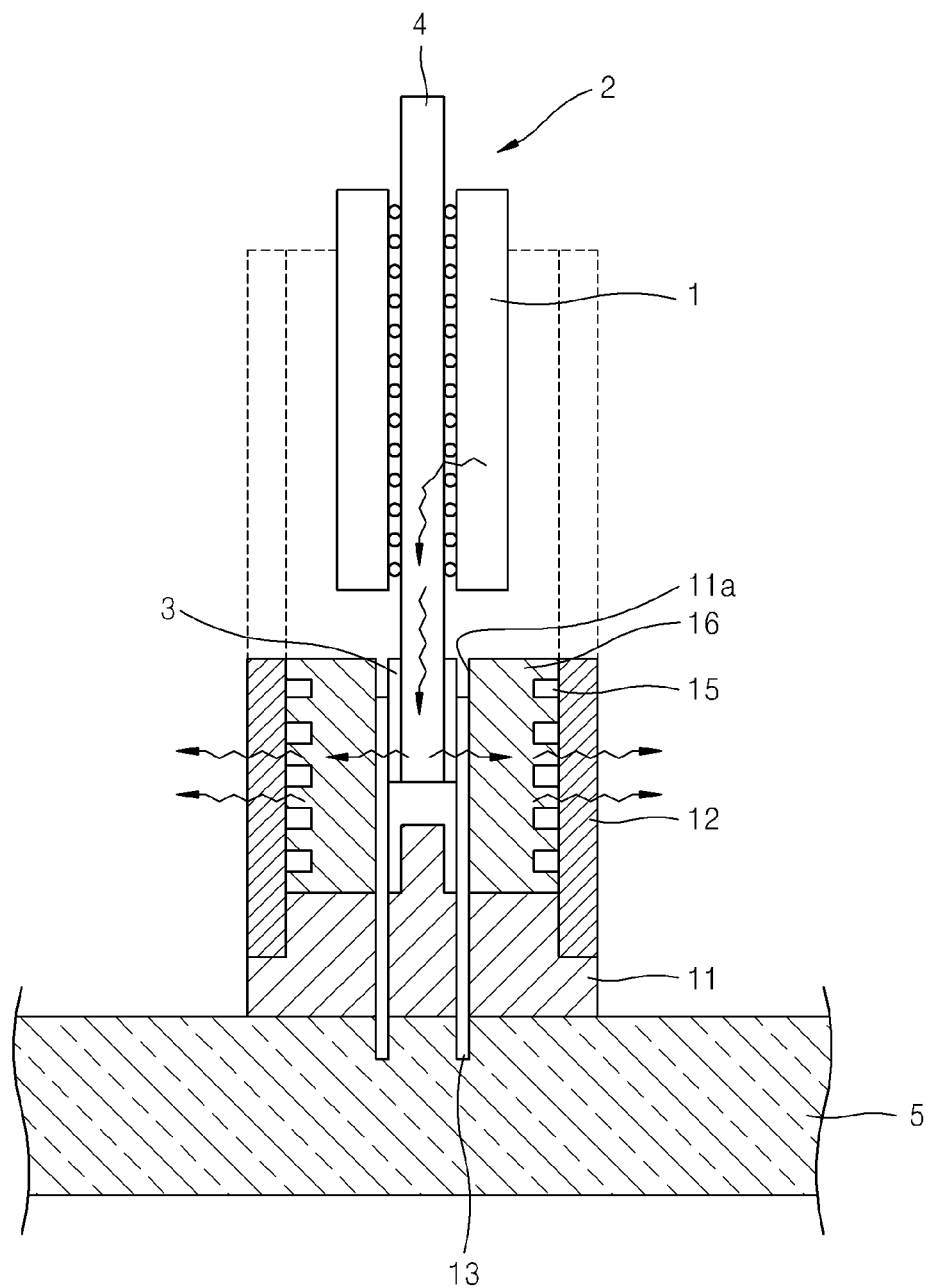
FIG. 2 is a cross-sectional view of the semiconductor module socket apparatus, taken along a line II-II of FIG. 1.

FIG. 1 is a perspective view of a semiconductor module socket apparatus according to an embodiment of the inventive concept. FIG. 2 is a cross-sectional view of the semiconductor module socket apparatus, taken along a line II-II of FIG. 1.

As illustrated in FIGS. 1 and 2, the semiconductor module socket apparatus may include a socket main body 11, a socket pin 13, a heat radiating member 12, and a heat delivering medium 14.

Here, the socket main body 11 in which a socket groove 11a corresponding to a semiconductor module 2 is formed may include a semiconductor memory module socket main body for electrically connecting a main board 5 of a computer with a memory semiconductor module 2 in which a plurality of semiconductor memory packages 1 are mounted on a circuit substrate 4, and may also include all socket-shaped socket main bodies in which various types of semiconductor modules including graphic cards, sound cards, or modem cards of a computer are removably coupled thereto.

Figure 3:
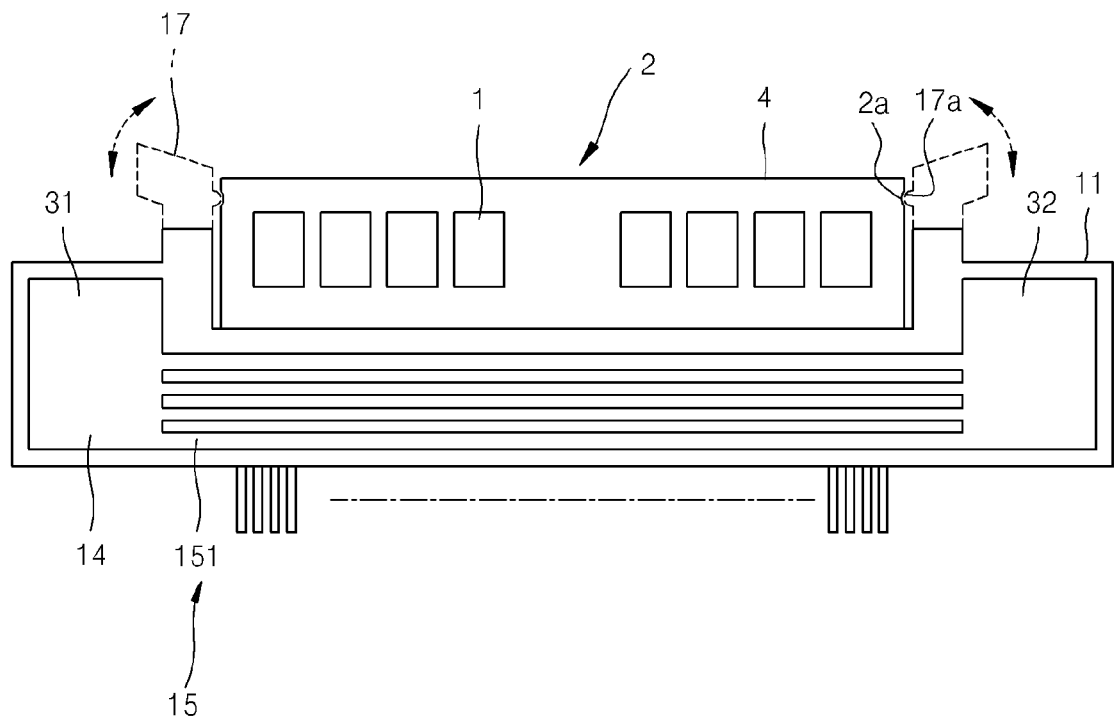
FIG. 3 is a front view of a heat delivering medium of a semiconductor module socket apparatus according to another embodiment of the inventive concept.

As illustrated in FIG. 3, it is possible that a ratchet 17 having a tooth 17a for engaging with a tooth groove 2a of the semiconductor module 2 is formed at both sides of the socket groove 11a of the socket main body 11.

The ratchet 17 may have the tooth 17a engaged with the tooth groove 2a so as to prevent the semiconductor module 2 from being easily detached from the socket groove 11a, and may have the memory semiconductor module 2 aligned in a correct position of the socket groove 11a.

Also, as illustrated in FIG. 2, the socket pin 13 is mounted in the socket groove 11a of the socket main body 11 so as to be electrically connected to a module pin 3 of the semiconductor module 2. However, the socket pin 13 may be electrically connected to a board or a substrate other than being electrically connected to the main board 5 of the computer.

As illustrated in FIGS. 1 and 2, the heat radiating member 12 is mounted in the socket main body 11 so as to prevent heat, which is generated in the semiconductor module 2, from being transferred to the main board 5. The heat radiating member 12 externally radiates the heat that is generated in the semiconductor module 2 and then is transferred from the socket groove 11a and the socket pin 13.

Here, as illustrated in FIGS. 1 and 2, the heat radiating member 12 may include various forms of heat radiating members, and in particular, may include a heat radiating plate that is flat, formed of a metal material, and exposed to one surface of the socket main body 11 so as to minimize a space.

Figure 7:
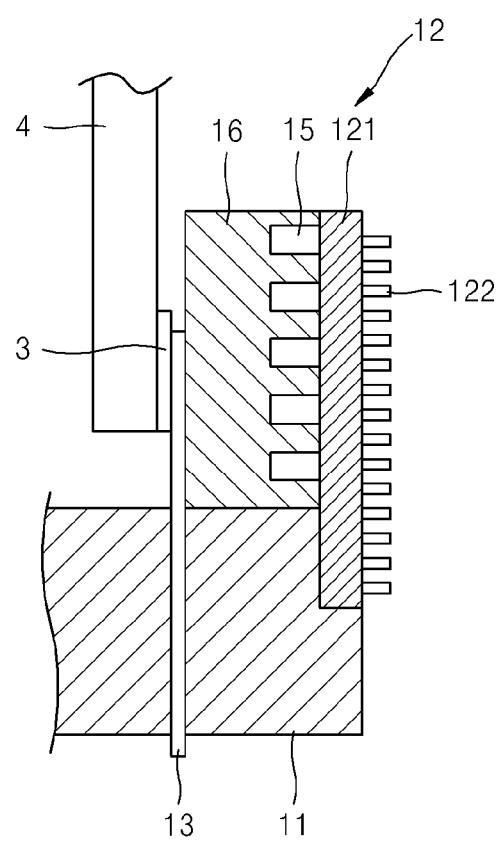
FIG. 7 is a magnified cross-sectional view of an insulating heat radiating member of the semiconductor module socket apparatus of FIG. 2 according to another embodiment of the inventive concept.

Also, as illustrated in FIG. 7, the heat radiating member 12 may include a plurality of heat radiating pins 122 that are formed of a metal material and exposed to one surface of the heat radiating plate 121 so as to enlarge a heat radiation area and thus increase heat radiation efficiency.

Thus, the heat generated in the semiconductor module 2 may not be transferred to the main board 5 but may be radiated to the outside without noise and vibration via the heat radiating member 12 that is mounted in the socket main body 11.

Meanwhile, the heat delivering medium 14 may be stored in a hollow portion of the socket main body 11 so as to maximize the heat radiation efficiency of the heat radiating member 12, and may be a material in a gas state or a liquid state which is thermally connected to the heat radiating member 12.

In order to allow the active flow of the heat delivering medium 14 due to, for example, heat convection therein, the heat delivering medium 14 may include one selected from the group consisting of water, acetone, alcohol, a freon gas, a volatile material, a phase change material, and any combinations thereof.

Figure 4:
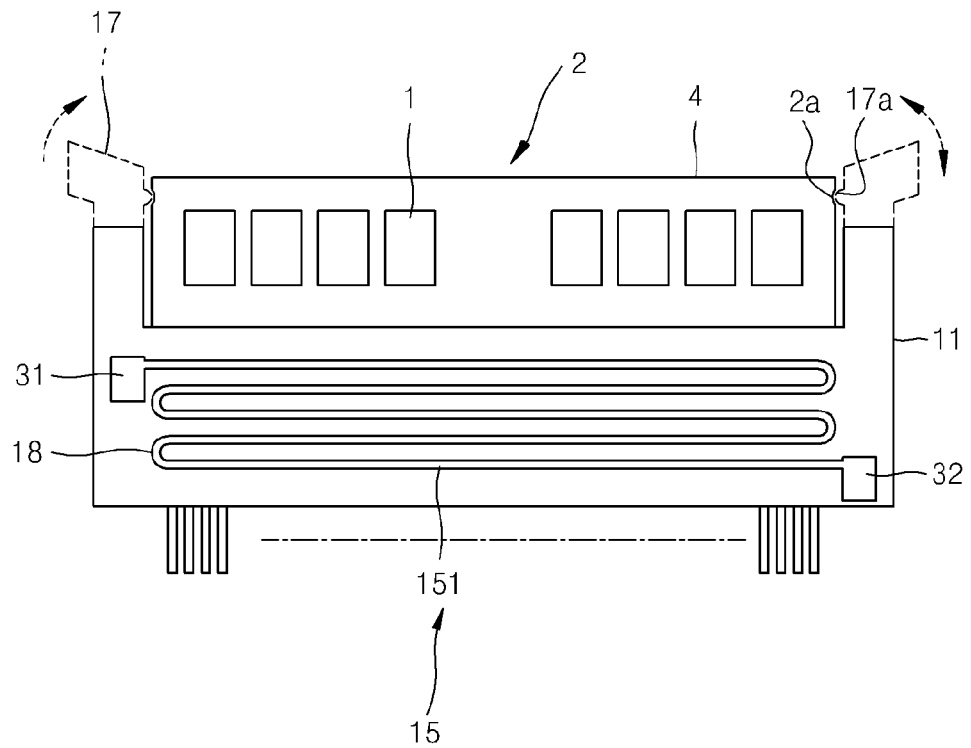
FIG. 4 is a front view of a heat delivering medium of a semiconductor module socket apparatus according to another embodiment of the inventive concept.

Also, as illustrated in FIGS. 3 and 4, the hollow portion for storing the heat delivering medium 14 may include a first heat delivering medium storage tank 31 that is formed in one side of the socket groove 11a of the socket main body 11, a second heat delivering medium storage tank 32 that is formed in the other side of the socket groove 11a of the socket main body 11, and a connection element 15 for connection between the first heat delivering medium storage tank 31 and the second heat delivering medium storage tank 32.

Thus, the heat delivering medium 14 may increase a heat transfer efficiency while the heat delivering medium 14 moves between the first heat delivering medium storage tank 31 and the second heat delivering medium storage tank 32 via the connection element 15, and may rapidly distribute the heat transferred from the socket pin 13 to both sides of the socket main body 11.

Here, the connection element 15 may be a linear connection element 151 as illustrated in FIG. 3, may be a zigzag connection element 152 as illustrated in FIG. 4, or may have one having a shape selected from various combinations thereof.

Also, in FIGS. 3 and 4, the first heat delivering medium storage tank 31 and the second heat delivering medium storage tank 32 may be omitted, and only the connection element 15 including the linear connection element 151 or the zigzag connection element 152 may be formed.

Meanwhile, as illustrated in FIG. 2, in order to further maximize the heat radiation efficiency, the socket main body 11 may have a structure in which an electrically insulating (nonconductor) thermal interface material (TIM) 16 such as a thermal tape or a thermal grease with high thermal conductivity is disposed between the socket pin 13 and the heat radiating member 12 so as to deliver the heat of the socket pin 13 to the heat radiating member 12.

Figure 6:
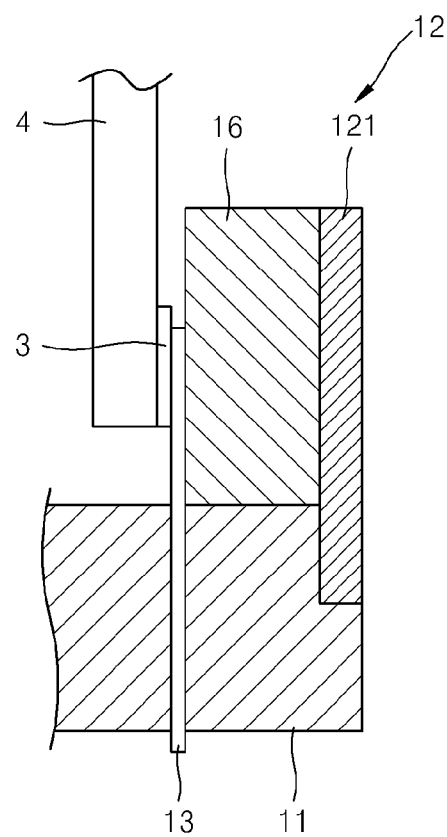
FIG. 6 is a magnified cross-sectional view of a nonconductor thermal interface material (TIM) of the semiconductor module socket apparatus of FIG. 2 according to another embodiment of the inventive concept.

As illustrated in FIG. 6, the electrically insulating (nonconductor) TIM 16 may replace the heat delivering medium 14 in a manner that the connection element 15 of FIG. 2 is removed.

Thus, as illustrated in FIG. 2, a heat radiation procedure of the semiconductor module socket apparatus according to the present embodiment is performed in a manner that the heat generated in the semiconductor memory packages 1 is thermally conducted along the circuit substrate 4 of the semiconductor module 2, and then is delivered to the socket pin 13 via the module pin 3. Afterward, the electrically insulating (nonconductor) TIM 16 thermally contacting the socket pin 13 absorbs the heat and delivers the heat to the heat delivering medium 14 in the connection element 15, and the heat that is delivered to the heat delivering medium 14 may not be delivered to the main board 5 but may be radiated to the outside via the heat radiating plate 121 in which a heat exchange with the heat delivering medium 14 occurs.

Figure 5:
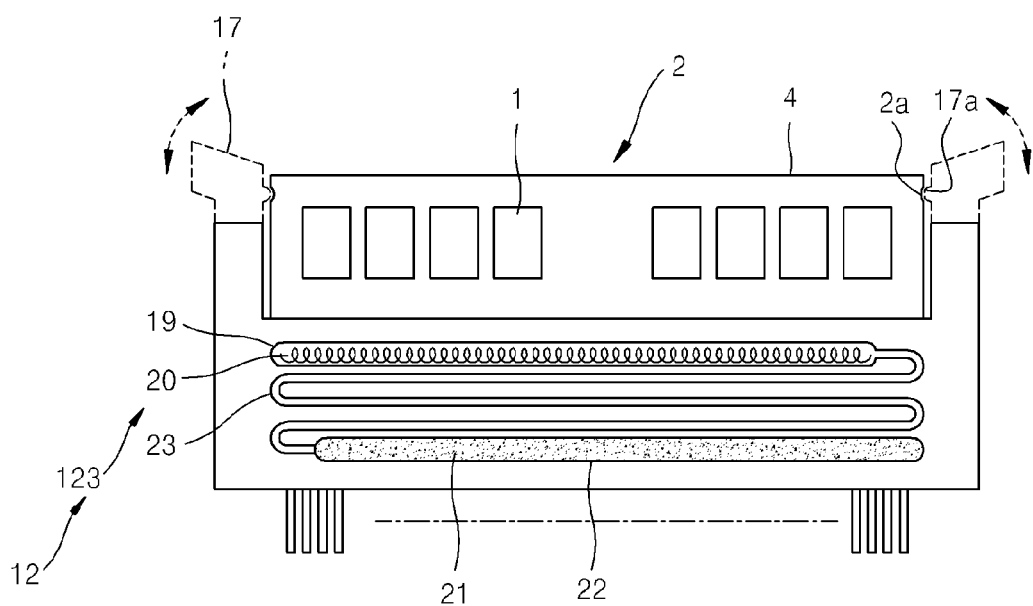
FIG. 5 is a front view of a heat delivering medium of a semiconductor module socket apparatus according to another embodiment of the inventive concept.

FIG. 5 is a front view of a heat delivering medium of a semiconductor module socket apparatus according to another embodiment of the inventive concept.

As illustrated in FIG. 5, the heat radiating member 12 may be a heat pipe 123 in which a working fluid is disposed.

Here, as illustrated in FIG. 5, the heat pipe 123 may include a vaporization unit 19 having a porous material 20 formed therein for easy vaporization of the working fluid, a condensation unit 22 in which a condensation accelerating element 21 including a protrusion or a groove is formed to allow easy condensation of the working fluid, and a movement element unit 23 for connection between the vaporization unit 19 and the condensation unit 22.

Thus, heat exchange efficiency may be maximized by repeating a circulation procedure in which the working fluid is vaporized in the vaporization unit 19, moves in a gas state via the movement element unit 23, is condensed in the condensation unit 22, and then moves in a liquid state via the movement element unit 23.

While the inventive concept has been particularly shown and described with reference to exemplary embodiments thereof, it will be understood that various changes in form and details may be made therein without departing from the spirit and scope of the following claims.

What is claimed is:

1. A semiconductor module socket apparatus comprising;
   a socket main body having a socket groove defined therein, the socket groove configured to receive a semiconductor module;
   a socket pin mounted in the socket groove of the socket main body so as to be electrically connected to a module pin of the semiconductor module; and
   a heat radiating member configured to thermally couple to the socket pin of the socket main body so as to externally radiate heat generated in the semiconductor module and transfer through the socket groove and the socket pin, wherein the socket main body has a nonconductor thermal interface material (TIM) formed between the socket pin and the heat radiating member so as to deliver the heat of the socket pin to the heat radiating member.

2. The semiconductor module socket apparatus of claim 1, wherein the socket pin is electrically connected to a main board of a computer.

3. The semiconductor module socket apparatus of claim 1, wherein a ratchet having a tooth for engaging with a tooth groove of the semiconductor module is formed at both sides of the socket groove of the socket main body.

4. The semiconductor module socket apparatus of claim 1, wherein the heat radiating member includes a heat radiating plate formed of a metal material, the heat radiating plate exposed at one surface of the socket main body.

5. The semiconductor module socket apparatus of claim 1, wherein the heat radiating member includes a plurality of heat radiating pins formed of a metal material, the plurality of heat radiating pins exposed at one surface of the socket main body.

6. The semiconductor module socket apparatus of claim 1, further comprising a heat delivering medium that is stored in a hollow portion of the socket main body and is thermally connected to the heat radiating member.

7. The semiconductor module socket apparatus of claim 6, wherein the heat delivering medium comprises one selected from the group consisting of water, acetone, alcohol, a freon gas, a volatile material, a phase change material, and any combinations thereof, so as to allow the flow of the heat delivering medium therein.

8. The semiconductor module socket apparatus of claim 6, wherein the hollow portion comprises a connection element comprising one selected from a group consisting of a linear connection element, a zigzag connection element, and a combination thereof.

9. The semiconductor module socket apparatus of claim 1, wherein the heat radiating member comprises a heat pipe in which a working fluid is disposed.

10. The semiconductor module socket apparatus of claim 9, wherein the heat pipe comprises:
    a vaporization unit having a porous material therein for easy vaporization of the working fluid;
    a condensation unit in which a condensation accelerating element is formed to allow easy condensation of the working fluid; and
    a movement element unit for connection between the vaporization unit and the condensation unit.

11. The semiconductor module socket apparatus of claim 1, wherein a second surface of the heat radiating member is configured to be exposed to an outside, the first surface and the second surface being opposite to each other.

12. The semiconductor module socket apparatus of claim 1, wherein the first surface of the heat radiating member is configured to entirely face the contacting area.

13. The semiconductor module socket apparatus of claim 1, further comprising:
    a heat delivering medium in a hollow portion of the socket main body, the heat delivering medium thermally coupled to the heat radiating member,
    wherein the hollow portion includes at least one heat delivering medium storage tank in at least one side of the socket groove of the socket main body.

14. The semiconductor module socket apparatus of claim 13, wherein the at least one heat delivering medium storage tank includes,
    a first heat delivering medium storage tank in a first side of the socket groove of the socket main body;
    a second heat delivering medium storage tank in a second side of the socket groove of the socket main body.

15. The semiconductor module socket apparatus of claim 14, further comprising:
    a connection element between the first heat delivering medium storage tank and the second heat delivering medium storage tank.

16. The semiconductor module socket apparatus of claim 15, wherein the connection element includes one selected from a group consisting of a linear connection element, a zigzag connection element, and a combination thereof.

17. The semiconductor module socket apparatus of claim 14, wherein in the first and second sides of the socket groove of the socket main body are opposite to each other.

18. The semiconductor module socket apparatus of claim 13, further comprising:
    a connection element between two opposite sides of the socket groove of the socket main body, the connection element configured to be coupled to the at least one heat delivering medium storage tank.

* * * * *